(12) United States Patent
Zhang

(10) Patent No.: US 7,247,550 B2
(45) Date of Patent: Jul. 24, 2007

(54) SILICON CARBIDE-BASED DEVICE CONTACT AND CONTACT FABRICATION METHOD

(75) Inventor: Qingchun Zhang, Ventura, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 56 days.

(21) Appl. No.: 11/053,800

(22) Filed: Feb. 8, 2005

(65) Prior Publication Data

US 2006/0178016 A1    Aug. 10, 2006

(51) Int. Cl.
*H01L 21/44* (2006.01)

(52) U.S. Cl. .............. 438/597; 438/621; 438/570; 438/931; 257/E21.054; 257/E21.163; 257/E21.173; 257/E21.359; 257/E29.104

(58) Field of Classification Search .............. 257/77, 257/281, 335, 471, 473, 474, 502; 438/597, 438/45, 174, 194, 418, 419, 446, 447, 430, 438/433, 570, 621, 931
See application file for complete search history.

(56) References Cited

U.S. PATENT DOCUMENTS

| | | | | | |
|---|---|---|---|---|---|
| 5,270,554 | A | * | 12/1993 | Palmour | 257/77 |
| 5,679,966 | A | * | 10/1997 | Baliga | 257/139 |
| 6,979,863 | B2 | * | 12/2005 | Ryu | 257/335 |
| 6,998,322 | B2 | * | 2/2006 | Das | 438/393 |

* cited by examiner

*Primary Examiner*—David Nhu
(74) *Attorney, Agent, or Firm*—Koppel, Patrick, Heybl & Dawson

(57) ABSTRACT

A silicon carbide-based device contact and contact fabrication method employ a layer of poly-silicon on a SiC substrate, with the contact's metal layer deposited on top of the poly-silicon. Both Schottky and ohmic contacts can be formed. The poly-silicon layer can be continuous or patterned, and can be undoped or doped to be n-type or p-type. The present contact and method provide excellent contact adhesion, and can be employed with a number of different device types, to provide electrical contacts for Schottky diodes, pn diodes, and transistors, for example.

18 Claims, 6 Drawing Sheets

SILICON CARBIDE-BASED DEVICE CONTACT AND CONTACT FABRICATION METHOD

BACKGROUND OF THE INVENTION

1. Field of the Invention

This invention relates to the field of discrete power device and integrated circuit (IC) contacts, and particularly to contacts for use on silicon carbide (SiC) substrates.

2. Description of the Related Art

Electrical contacts are used to enable electrical signals to be conveyed into and out of a semiconductor device. Such contacts include a metal layer. When the voltage across and the current through the metal-semiconductor junction has a linear current-voltage (I–V) relationship, the contact is referred to as an "ohmic" contact. When the contact's I–V relationship has the characteristics of a forward-biased diode, the contact is referred to as a Schottky contact.

Silicon carbide (SiC) is a semiconductor material which is becoming increasingly popular, particularly for high power applications. Ohmic contacts to n-type SiC are conventionally provided using a metal layer of nickel (Ni), while aluminum/titanium (Al/Ti), Ti, or Al/Ni are generally used with p-type SiC. Schottky contacts are conventionally provided with Ni or Ti or others for n-type or p-type SiC.

Unfortunately, contacts for SiC-based devices present certain difficulties, particularly with respect to ohmic contacts. Conventional ohmic contacts on SiC as described above require a high temperature (>1050° C.) annealing step to obtain low specific contact resistance (a parameter related to a contact's resistance versus its area). This annealing step can cause the formation of a carbon-rich interface between the SiC substrate and the metal, which can result in poor adhesion for the metal, and degraded device reliability. In addition, the high temperature at which the annealing process is performed may cause other device parameters to be degraded, such as the channel mobility for MOS-gate based devices.

SUMMARY OF THE INVENTION

A silicon carbide-based device contact and contact fabrication method are presented which overcome the problems noted above, providing ohmic and Schottky contacts with excellent adhesion without requiring a high temperature annealing step.

The present contact employs a layer of poly-silicon on a SiC substrate, with the contact's metal layer deposited on top of the poly-silicon. Assuming proper processing, a Schottky contact is formed when the metal layer is a Schottky barrier metal and the contact is to be made to a portion of the SiC substrate which is not highly-doped, and an ohmic contact is formed when the contact is to be made to a region of the substrate which has been highly doped. The presence of the poly-silicon layer avoids the carbon-rich interface problem known in the prior art, and enables the annealing process to be performed at a much lower temperature—thereby minimizing the parameter degradation that might otherwise occur.

The poly-silicon layer can be continuous or patterned into, for example, stripes or islands. It can be undoped, or doped to be n-type or p-type. The present contact and method can be employed with a number of different device types, to provide electrical contacts to Schottky diodes, pn diodes, and transistors, for example.

Further features and advantages of the invention will be apparent to those skilled in the art from the following detailed description, taken together with the accompanying drawings.

DETAILED DESCRIPTION OF THE INVENTION

Figure 1:
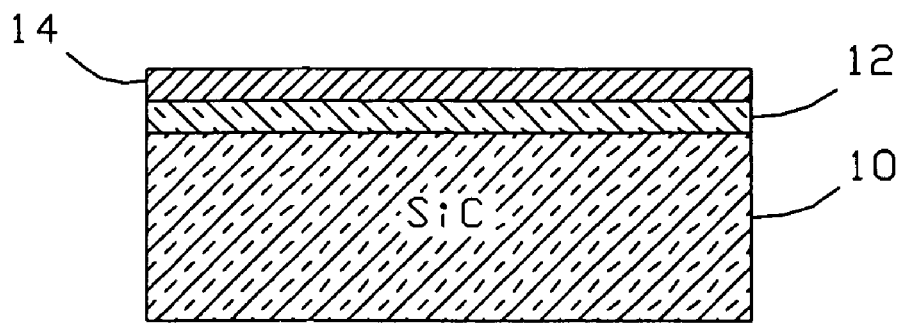
FIG. 1 is a sectional diagram of a SiC-based device per the present invention.

An SiC-based device having a contact in accordance with the present invention is shown in FIG. 1. The device comprises a SiC substrate 10, to which an electrical contact is to be made. To effect a contact, a poly-silicon layer 12 is deposited on the surface of substrate 10, and a metal layer 14 is deposited on poly-silicon layer 12.

Metal layer 14 provides a contact to SiC substrate 10 via poly-silicon layer 12. The use of the poly-silicon has several beneficial effects. Interposing poly-silicon layer 12 between metal layer 14 and SiC substrate 10 eliminates the carbon-rich interface known in the prior art, such that a contact having excellent adhesion to the substrate is provided. In addition, with poly-silicon layer 12 in place, if the device's fabrication process calls for an annealing step after metal layer 14 is deposited, the anneal can be done at a lower temperature than in the prior art. For example, an ohmic contact can be formed between metal layer 14 and SiC substrate 10 with an anneal performed at a temperature of <600° C., as opposed to the >1050° C. anneal temperatures typically required in the prior art. This serves to reduce the possibility of degrading other device parameters such as gate oxide mobility due to thermal stress, such as gate oxide mobility due to thermal stress, and contamination due to the high-temperature induced carbon-rich interface referred to above.

Figure 2:
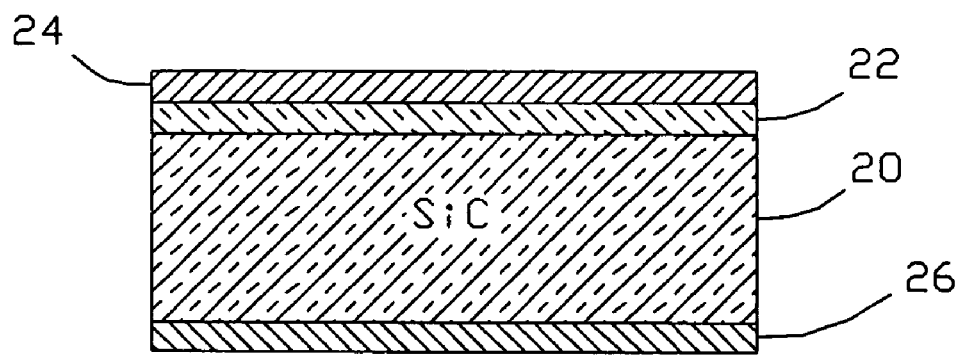
FIG. 2 is a sectional diagram of a SiC-based diode per the present invention.

The present invention can be used to form Schottky contacts or ohmic contacts. For example, in FIG. 2, a SiC substrate 20 has a poly-silicon layer 22 on its surface, and a metal layer 24 is on poly-silicon layer 22. Assuming that substrate 20 is not highly doped in the region below layers 22 and 24, metal layer 24 is a Schottky barrier metal, and appropriate process steps are performed (discussed below), a Schottky contact will be formed between metal layer 24 and SiC substrate 20. When SiC substrate 20 has been doped n-type or p-type, the Schottky barrier metal can be Ni, Ti or others. As shown in FIG. 2, a device such as a Schottky diode can be formed by depositing a metal layer 26 on the surface of substrate 20 opposite poly-silicon layer 22.

Figure 3:
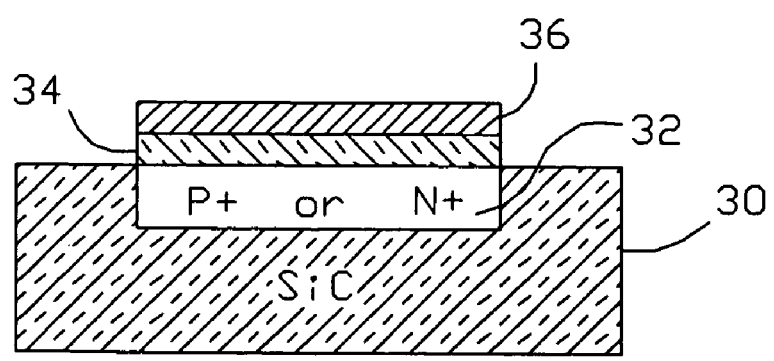
FIG. 3 is a sectional diagram of a SiC-based device with an ohmic contact per the present invention.

An ohmic contact in accordance with the present invention is formed as shown in FIG. 3. Here, a SiC substrate 30 includes a region 32 that is highly doped, so that it takes on a N+ or P+ polarity; highly-doped region 32 would serve, for example, as the anode of a SiC-based diode. A poly-silicon layer 34 is deposited and patterned (i.e., masked and etched) or is selectively deposited such that it is on region 32, and a metal layer 36 is deposited and patterned or is selectively deposited such that it is on poly-silicon layer 34. When properly processed (as discussed below), an ohmic contact is formed between poly-silicon layer 34 and doped region 32, and between metal layer 36 and poly-silicon layer 34. As noted above, the ohmic contact features excellent adhesion to the SiC substrate, and the final annealing step can be performed at a temperature low enough to reduce or eliminate device parameter degradation that might otherwise occur.

Poly-silicon layer 34 may be undoped, doped p-type, or doped n-type, depending on the requirements of a particular application. When region 32 is N+, poly-silicon layer 34 would preferably be doped to be n-type. Dopants suitable for this purpose include phosphorous and nitrogen. When region 32 is P+, poly-silicon layer 34 would preferably be doped to be p-type, with aluminum and boron being suitable dopants. Metal layer 36 for an ohmic contact per the present invention can be, for example, Al, Ti, or Ni, or some combination of these.

When the poly-silicon layer is doped, the formation of an ohmic contact requires that the dopant be activated. This requires the device to be subjected to an elevated temperature for a particular period of time, with the specific time and temperature being dopant-specific. A temperature of about ~900° C. for at least 30 minutes would be typical. This step serves to activate the dopant, and to drive the dopant deeper into the poly-silicon layer, thereby forming an ohmic contact between the poly-silicon and SiC. There is no degradation to other device parameters during this step, because of the absence of metal film and the relatively low process temperature. An ohmic contact between the poly-silicon and metal is then formed during the anneal step performed after the metal layer is deposited.

Figure 4:
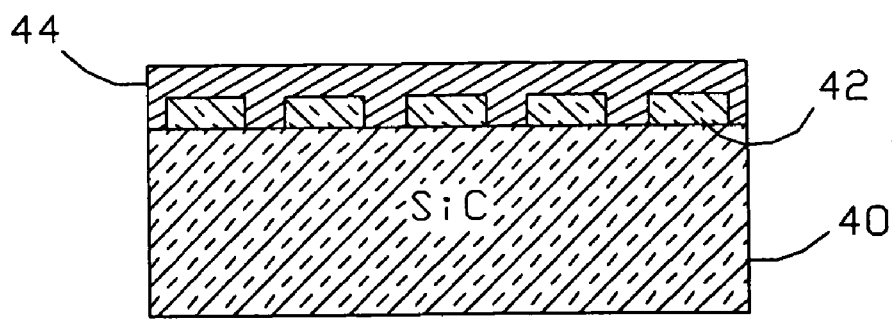
FIG. 4 is a sectional diagram of another embodiment of a SiC-based device per the present invention.

The present device's poly-silicon layer can be continuous, as shown in FIG. 1 and 2, continuous over a particular area, as in FIG. 3, or patterned into periodically-spaced features such as stripes or islands. This last approach is illustrated in FIG. 4. Here, a poly-silicon layer is deposited on a SiC substrate 40, doped if appropriate, and then patterned to form periodically-spaced stripes or islands 42 as shown. A metal layer 44 is then deposited as before.

Care should be taken when determining the spacing between the poly-silicon features. If the spacing between features is too wide, there may be an adhesion problem in the "in-between" areas. This can be avoided if the spacing between features is kept narrow. The use of poly-silicon serves to improve the adhesion between the contact and the SiC substrate. However, the specific contact resistance may be somewhat higher for a poly-silicon/SiC interface than it is for a metal/SiC interface. Thus, the use of periodically-spaced features as described above acts to improve the contact's adhesion properties, while keeping the specific contact resistance relatively low.

When periodically-spaced poly-silicon features are employed as shown in FIG. 4, it is preferred that an ohmic contact be formed between the metal layer and the SiC substrate in the "in-between" areas, in addition to the metal-to-SiC ohmic contact provided via the poly-silicon. This would generally require the performance of a high temperature annealing step. Due to the presence of the poly-silicon, contact adhesion problems that might otherwise arise due to the annealing step are mitigated. Failing to form an ohmic contact in the "in-between" areas can result in a high specific contact resistance in those areas, due to the presence of a Schottky barrier between metal and SiC.

Figure 5:
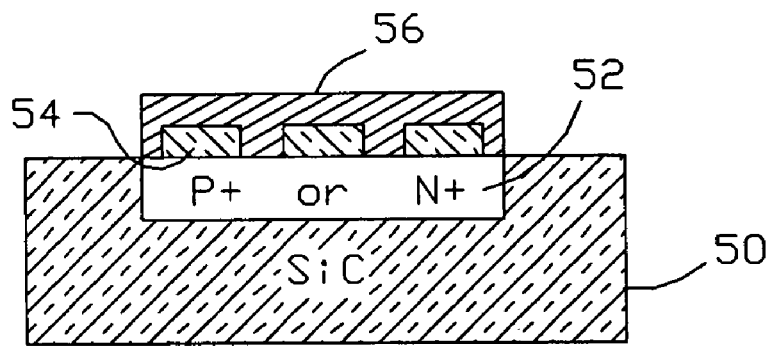
FIG. 5 is a sectional diagram of another embodiment of a SiC-based device with an ohmic contact per the present invention.

The patterned poly-silicon layer described in relation to FIG. 4 can be used to form a Schottky contact (assuming the use of a Schottky barrier metal and appropriate processing) or an ohmic contact. The latter case is illustrated in FIG. 5. A SiC substrate 50 includes a highly-doped P+ or N+ region 52. A poly-silicon layer is deposited or selectively deposited, and then patterned such that poly-silicon features 54 are formed on region 52. A metal layer 56 is deposited and patterned or is selectively deposited such that it is on poly-silicon features 54 and highly-doped region 52. When properly processed (as discussed below), ohmic contacts are formed between poly-silicon features 54 and doped region 52, between metal layer 56 and poly-silicon features 54, and between metal layer 56 and doped region 52.

Figure 6:
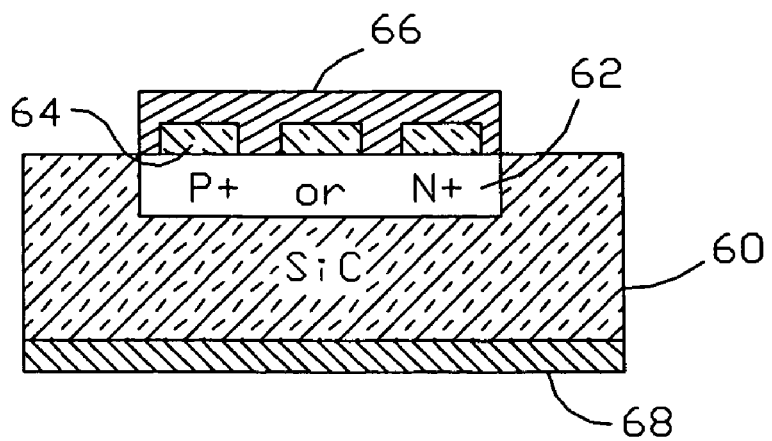
FIG. 6 is a sectional diagram of another embodiment of a SiC-based diode with an ohmic contact per the present invention.

The present invention can be employed as part of many different SiC-based devices, including diodes, bipolar transistors, IGBTs, MOSFETs, JFETs, thyristors and MCTs. In FIG. 6, for example, a SiC-based diode is formed. A SiC substrate 60 includes a highly-doped P+ or N+ region 62. Poly-silicon features 64 and a metal layer 66 are on region 62. A diode is formed by adding a metal layer 68 such as nickel on the opposite side of the SiC substrate (assuming proper processing). Other SiC-based devices could be similarly fabricated.

Figure 7:
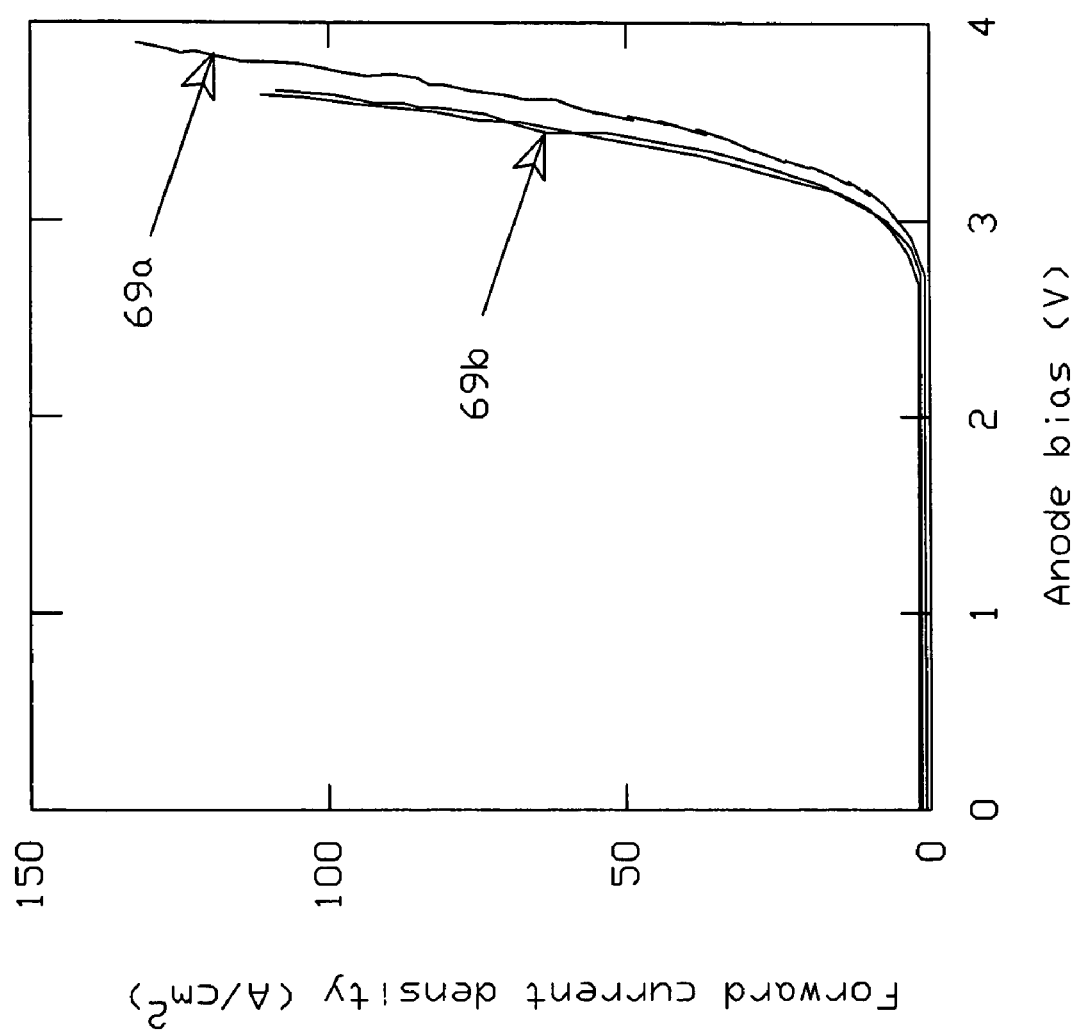
FIG. 7 is a graph plotting forward current density vs. anode bias for a prior art SiC-based diode and a SiC-based diode per the present invention.

One aspect of the improvement in performance provided by the present invention is seen in the graph shown in FIG. 7, which plots forward current density vs. anode bias for a prior art SiC-based diode (69a), and typical SiC-based diodes per the present invention (69b). The J–V characteristics were measured at room temperature. The ohmic contacts realized in accordance with the present invention provided lower on-state resistance, thereby enabling current density to be higher at a lower anode bias voltage when compared with a prior art SiC-based diode.

Figure 8:
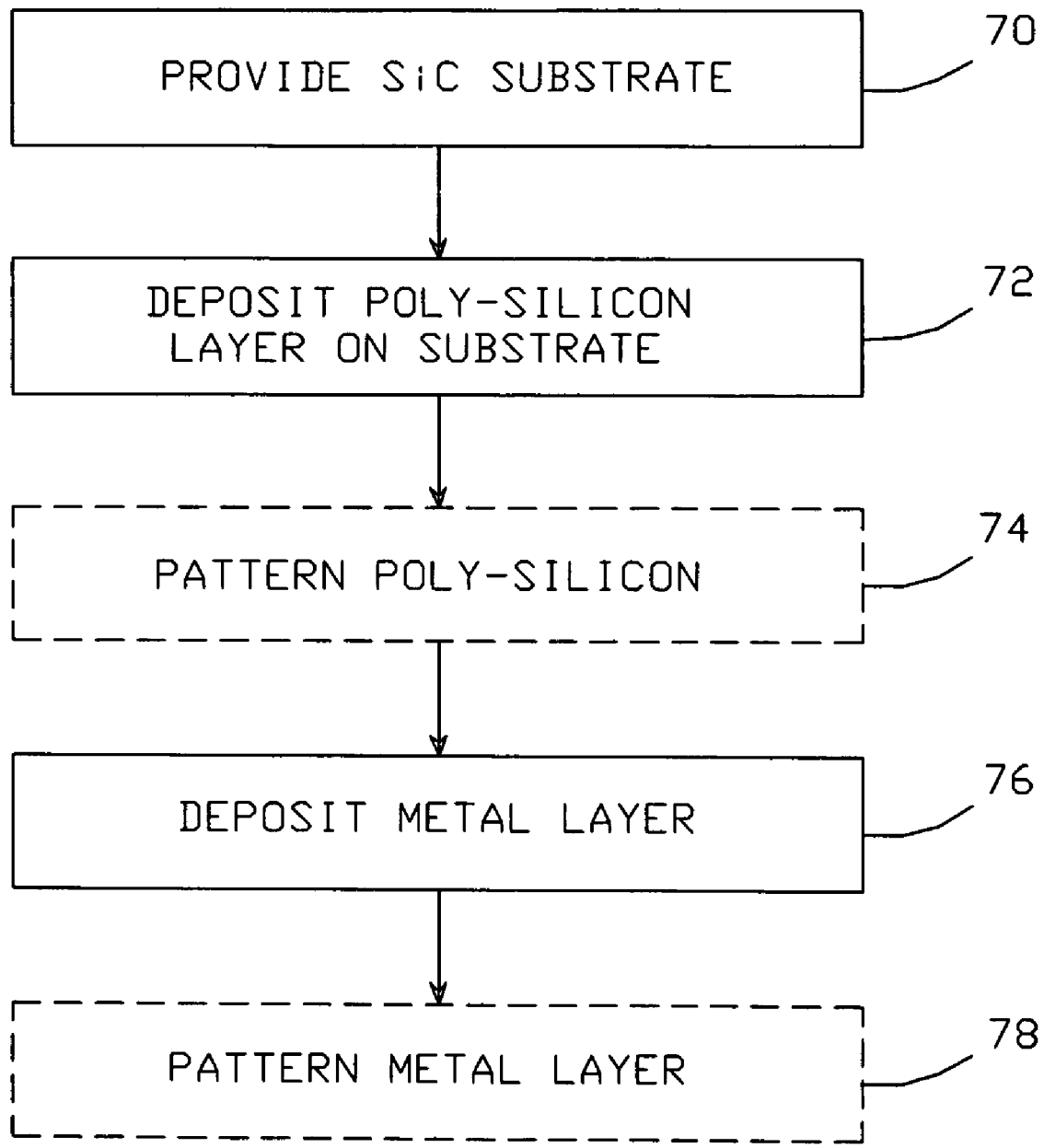
FIG. 8 is a flow chart of process steps used to fabricate a contact for a SiC-based device per the present invention.

The basic process for fabricating an electrical contact for a SiC-based device per the present invention is illustrated in FIG. 8. In step 70, a SiC substrate is provided, doped as needed for a specific application. A layer of poly-silicon is deposited on the SiC substrate (step 72). This is preferably done using chemical vapor deposition (CVD), but other deposition techniques, such as sputtering or laser deposition, could also be used. If periodically-spaced poly-silicon features are desired, the poly-silicon layer is patterned (step 74). A layer of a metal appropriate to the application is then deposited (step 76), and patterned if desired (step 78). Additional process steps specific to the formation of a Schottky contact or an ohmic contact might also be required; these are discussed below.

Figure 9:
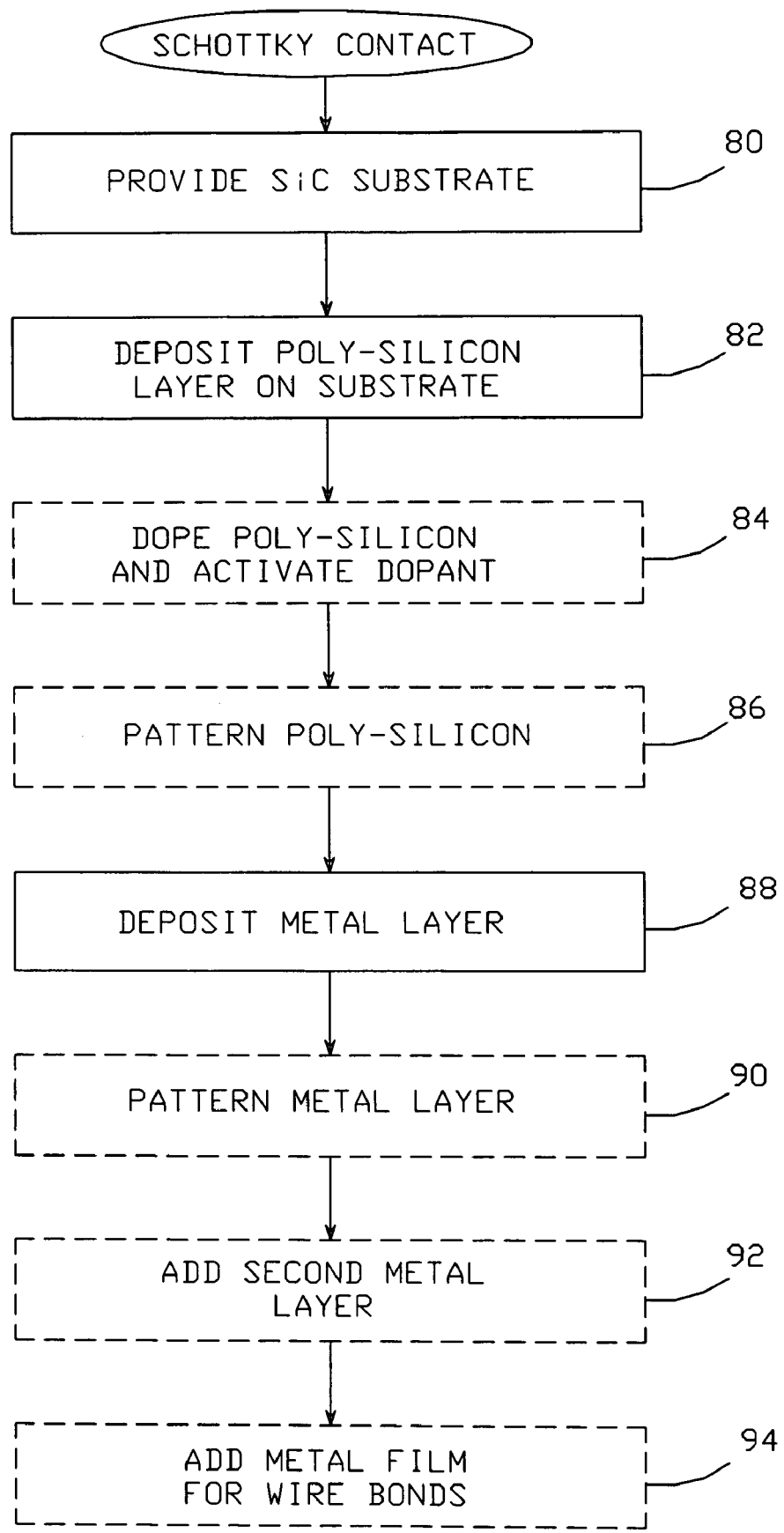
FIG. 9 is a flow chart of process steps used to fabricate a Schottky contact for a SiC-based device per the present invention.

A process for fabricating a Schottky contact for a SiC-based device is illustrated in more detail in FIG. 9. As before, a SiC substrate, doped as needed, is provided (step 80), and a layer of poly-silicon is deposited on the SiC substrate (step 82). As previously noted, the poly-silicon layer can be undoped, or doped n-type or p-type. If the poly-silicon layer is to be doped, the dopant is implanted or introduced in-situ, and activated (step 84). As noted above, dopants suitable for making the poly-silicon n-type include phosphorous and nitrogen; aluminum and boron are dopants for p-type poly-silicon. The dopant is activated and driven in by subjecting the device to an elevated temperature for a particular period of time; a temperature of about ~900° C. for at least 30 minutes would be typical.

If periodically-spaced poly-silicon features are desired, the poly-silicon layer is patterned (step 86). A Schottky barrier metal appropriate to the application (Ni, Ti, or others for n-type or p-type SiC) is then deposited (step 88), and patterned if desired (step 90). Note that no annealing step is performed when forming a Schottky contact, because the elevated temperature could destroy the Schottky barrier.

To form a device such as a Schottky diode, a second layer of metal would be deposited next (step 92) on the opposite side of the SiC substrate. Metal film suitable for attaching wire bonds could be deposited as a final step (step 94).

Figure 10:
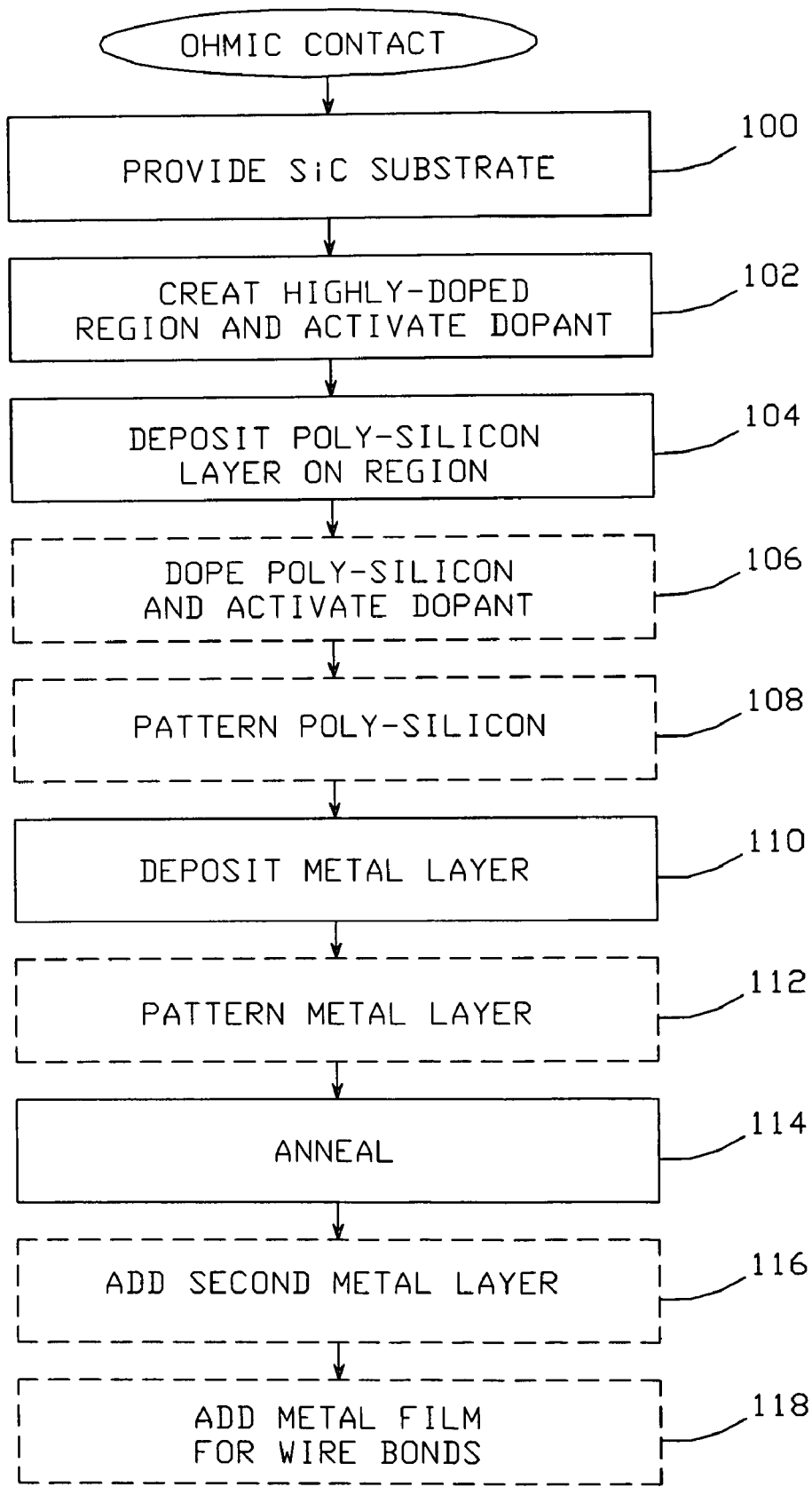
FIG. 10 is a flow chart of process steps used to fabricate a ohmic contact for a SiC-based device per the present invention.

A process for fabricating an ohmic contact for a SiC-based device is illustrated in more detail in FIG. 10. As before, a SiC substrate, doped as needed, is provided (step 100). A highly-doped region is created by doping a region near the substrate's surface, and activating the dopant—typically by subjecting the device to a high temperature for a particular time. For example, aluminum can be implanted into an n-type SiC substrate, and activated at high temperature (typically >1500° C.) to create a highly-doped P+ region which can serve as the device's anode.

A layer of poly-silicon is then deposited or is selectively deposited on the highly-doped region (step 104). As previously noted, the poly-silicon layer can be undoped, or doped n-type or p-type. If the poly-silicon layer is to be doped, the dopant is implanted or introduced in-situ, and activated and driven in (step 106) as described above—thereby forming an ohmic contact between the SiC and poly-silicon.

If periodically-spaced poly-silicon stripes or islands are desired, the poly-silicon layer is patterned (step 108). A layer of a metal appropriate to the application is then deposited (step 110) or selectively deposited, and patterned if desired (step 112).

An anneal step is performed next (step 114), thereby forming an ohmic contact between the poly-silicon and metal layer, and between the metal layer and SiC in any "in-between" areas. Due to the use of the poly-silicon layer, an ohmic contact can be formed via the poly-silicon layer with an anneal performed at a temperature of <600° C. The anneal step destroys any Schottky barrier that might exist, which is required if an ohmic contact is to be formed.

To form a device such as a diode, a second layer of metal would be deposited to the opposite side of the SiC substrate (step 116). Metal film suitable for attaching wire bonds could be deposited as a final step (step 118).

Note that the particular process sequences described above are merely exemplary. Many variations are possible, depending on, for example, the materials used, the particular device being manufactured, and the specifications to be met.

While particular embodiments of the invention have been shown and described, numerous variations and alternate embodiments will occur to those skilled in the art. Accordingly, it is intended that the invention be limited only in terms of the appended claims.

I claim:

1. A method of forming an electrical contact which conducts the DC operating current of a device formed on a silicon carbide (SiC) substrate, comprising:

providing a SiC substrate;

depositing a layer of poly-silicon on said SiC substrate; and depositing a layer of metal on said poly-silicon layer such that an electrical contact which conducts the DC operating current of a device formed on said SiC substrate is formed between said metal layer and said SiC substrate via said poly-silicon layer.

2. The method of claim 1, wherein said metal layer is a Schottky barrier metal and, said electrical contact is a Schottky contact.

3. The method of claim 2, further comprising depositing a metal layer on the surface of said SiC substrate opposite said poly-silicon layer such that said SiC substrate, poly-silicon, and metal layers form a Schottky diode.

4. The method of claim 2, further comprising patterning said poly-silicon layer to form periodically-spaced poly-silicon on said SiC substrate such that said metal layer contacts said SiC substrate directly in the spaces between said poly-silicon features.

5. The method of claim 1, further comprising doping said poly-silicon layer.

6. The method of claim 5, further comprising activating said dopant in said poly-silicon layer.

7. The method of claim 1, further comprising doping a region of said SiC substrate to be n-type or p-type material such that an ohmic contact is formed between said metal layer and said doped region via said poly-silicon layer.

8. The method of claim 7, further comprising performing an annealing step after said metal layer is deposited.

9. The method of claim 8, wherein said annealing step is performed at a temperature of <600° C.

10. The method of claim 7, further comprising patterning said poly-silicon and metal layers such that they are confined to the area of said substrate directly above said doped region.

11. The method of claim 7, further comprising doping said poly-silicon layer to have the same polarity as said SiC substrate.

12. The method of claim 7, further comprising patterning said poly-silicon layer to form periodically-spaced poly-silicon features on said doped region such that said metal layer contacts said substrate directly in the spaces between said poly-silicon features.

13. The method of claim 7, further comprising depositing a second layer of metal on said SiC substrate opposite said poly-silicon layer to form a SiC-based diode.

14. A method of forming an ohmic contact which conducts the DC operating current of a device formed on a silicon carbide (SiC) substrate, comprising:

providing a SiC substrate;

doping a region of said SiC substrate with an n-type or p-type dopant;

activating said n-type or p-type dopant material;

depositing a layer of poly-silicon on said SiC substrate;

depositing a layer of metal on said poly-silicon layer; and annealing said SiC substrate such that an ohmic contact which conducts the DC operating current of a device formed on said SiC substrate is formed between said metal layer and said SiC substrate via said poly-silicon layer.

15. The method of claim 14, further comprising doping said poly-silicon layer with a dopant to have the same polarity as said SiC substrate and activating said poly-silicon layer dopant.

16. The method of claim 14, further comprising patterning said poly-silicon layer to form periodically-spaced poly-silicon features on the doped region of said SiC substrate such that said metal layer contacts said SiC substrate directly in the spaces between said poly-silicon features, said annealing arranged to form an ohmic contact between said metal layer and the doped region of said SiC substrate in the spaces between said periodically-spaced poly-silicon features.

17. A method of forming a Schottky contact which conducts the DC operating current of a device formed on a silicon carbide (SiC) substrate, comprising:
 providing a SiC substrate;
 depositing a layer of poly-silicon on said SiC substrate; and
 depositing a layer of a Schottky barrier metal on said poly-silicon layer such that an electrical contact which conducts the DC operating current of a device formed on said SiC substrate is formed between said metal layer and said SiC substrate via said poly-silicon layer.

18. A method of forming an electrical contact which conducts the DC operating current of a device formed on a silicon carbide (SiC) substrate, comprising:
 providing a SiC substrate;
 depositing a layer of poly-silicon on said SiC substrate;
 patterning said poly-silicon layer to form periodically-spaced poly-silicon features on said SiC substrate; and
 depositing a layer of metal on said poly-silicon layer such that an electrical contact which conducts the DC operating current of a device formed on said SiC substrate is formed between said metal layer and said SiC substrate via said poly-silicon layer, and between said metal layer and said SiC substrate directly in the spaces between said poly-silicon features.

* * * * *

UNITED STATES PATENT AND TRADEMARK OFFICE
CERTIFICATE OF CORRECTION

PATENT NO. : 7,247,550 B2  Page 1 of 1
APPLICATION NO. : 11/053800
DATED : July 24, 2007
INVENTOR(S) : Qingchun Zhang It is certified that error appears in the above-identified patent and that said Letters Patent is hereby corrected as shown below:

In column 1, line 5 (following the title and preceding the heading "Background of the Invention"), the following government rights statement should be inserted:

-- This invention was made with Government support under Contract N00014-02-C-0301 awarded by the U.S. Navy, Office of Naval Research. The Government has certain rights in this invention. --

Signed and Sealed this

Twenty-third Day of December, 2008

JON W. DUDAS
*Director of the United States Patent and Trademark Office*